(12) United States Patent
Derner et al.

(10) Patent No.: US 10,811,083 B2
(45) Date of Patent: Oct. 20, 2020

(54) INTEGRATED ASSEMBLIES COMPRISING SUPPLEMENTAL SENSE-AMPLIFIER-CIRCUITRY FOR REFRESH

(71) Applicant: Micron Technology, Inc., Boise, ID (US)

(72) Inventors: Scott J. Derner, Boise, ID (US); Charles L. Ingalls, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/404,525

(22) Filed: May 6, 2019

(65) Prior Publication Data

US 2020/0051613 A1     Feb. 13, 2020

Related U.S. Application Data

(60) Provisional application No. 62/716,514, filed on Aug. 9, 2018.

(51) Int. Cl.
| | |
|---|---|
| *G11C 11/40* | (2006.01) |
| *G11C 11/4091* | (2006.01) |
| *G11C 11/4097* | (2006.01) |
| *G11C 11/408* | (2006.01) |
| *G11C 11/406* | (2006.01) |

(52) U.S. Cl.
CPC ...... *G11C 11/4091* (2013.01); *G11C 11/4085* (2013.01); *G11C 11/4097* (2013.01); *G11C 11/40615* (2013.01)

(58) Field of Classification Search
CPC ............ G11C 11/4091; G11C 11/4097; G11C 11/4085; G11C 11/40615; G11C 8/14; G11C 7/1048; G11C 11/4093; G11C 5/025; G11C 11/406
See application file for complete search history.

(56) References Cited

U.S. PATENT DOCUMENTS

| | | | |
|---|---|---|---|
| 6,480,424 B1 * | 11/2002 | Issa | G11C 7/1006 365/189.02 |
| 2004/0001382 A1 * | 1/2004 | Brennan | G11C 11/40615 365/205 |

* cited by examiner

*Primary Examiner* — Mohammed A Bashar
(74) *Attorney, Agent, or Firm* — Wells St. John P.S.

(57) ABSTRACT

Some embodiments include an integrated assembly having a first memory array which includes a first column of first memory cells. A first digit line extends along the first column and is utilized to address the first memory cells of the first column. A second memory array is proximate to the first memory array and includes a second column of second memory cells. A second digit line extends along the second column and is utilized to address the second memory cells of the second column. A primary-sense-amplifier comparatively couples the first digit line with the second digit line. A first secondary-sense-amplifier is along the first digit line, and a second secondary-sense-amplifier is along the second digit line.

20 Claims, 14 Drawing Sheets

INTEGRATED ASSEMBLIES COMPRISING SUPPLEMENTAL SENSE-AMPLIFIER-CIRCUITRY FOR REFRESH

RELATED PATENT DATA

This patent is related to U.S. Provisional Application Ser. No. 62/716,514, which was filed Aug. 9, 2018.

TECHNICAL FIELD

Integrated assemblies comprising supplemental sense-amplifier-circuitry for refresh.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which have one capacitor in combination with one transistor (so-called 1T-1C memory cells), with the capacitor being coupled with a source/drain region of the transistor. An example 1T-1C memory cell 2 is shown in FIG. 1, with the transistor labeled T and the capacitor labeled C. The capacitor has one node coupled with a source/drain region of the transistor, and another node coupled with a common plate, CP. The common plate may be coupled with any suitable voltage, such as a voltage within a range of from greater than or equal to ground to less than or equal to VCC (i.e., ground≤CP≤VCC). In some applications, the common plate is at a voltage of about one-half VCC (i.e., about VCC/2). The transistor has a gate coupled to a wordline WL (i.e., access line), and has a source/drain region coupled to a bitline BL (i.e., digit line or sense line). In operation, an electrical field generated by voltage along the wordline may gatedly couple the bitline to the capacitor during read/write operations.

Another prior art 1T-1C memory cell configuration is shown in FIG. 2. The configuration of FIG. 2 shows two memory cells 2a and 2b; with the memory cell 2a comprising a transistor T1 and a capacitor C1, and with memory cell 2b comprising a transistor T2 and a capacitor C2. Wordlines WL0 and WL1 are electrically coupled with the gates of transistors T1 and T2, respectively. A connection to a bitline BL is shared by the memory cells 2a and 2b.

The memory cells described above may be incorporated into memory arrays, and in some applications the memory arrays may have open bitline arrangements. An example integrated assembly 9 having open bitline architecture is shown in FIG. 3. The assembly 9 includes two laterally adjacent memory arrays ("Array 1" and "Array 2"), with each of arrays including memory cells of the type described in FIG. 2 (not labeled in FIG. 3 in order to simplify the drawing). Wordlines WL0-WL7 extend across the arrays, and are coupled with wordline drivers. Digit lines D0-D8 are associated with the first array (Array 1), and digit lines D0*-D8* are associated with the second array (Array 2). Sense amplifiers SA0-SA8 are provided between the first and second arrays. Digit lines at the same height are paired within one another and compared through a sense amplifier (e.g., digit lines D0 and D0* are paired with one another and compared with the sense amplifier SA0). In a read operation, one of the paired digit lines may serve as a reference in determining electrical properties (e.g., voltage) of the other of the paired digit lines.

A continuing goal of integrated circuit fabrication is to increase packing density and to thereby increase the level of integration. It would be desirable to develop three-dimensional arrangements having tightly packed memory. Another goal is to rapidly enable refresh of DRAM cells. It would be desirable to develop integrated memory configurations which enable rapid refresh of DRAM cells.

DETAILED DESCRIPTION OF THE ILLUSTRATED EMBODIMENTS

Figure 3:
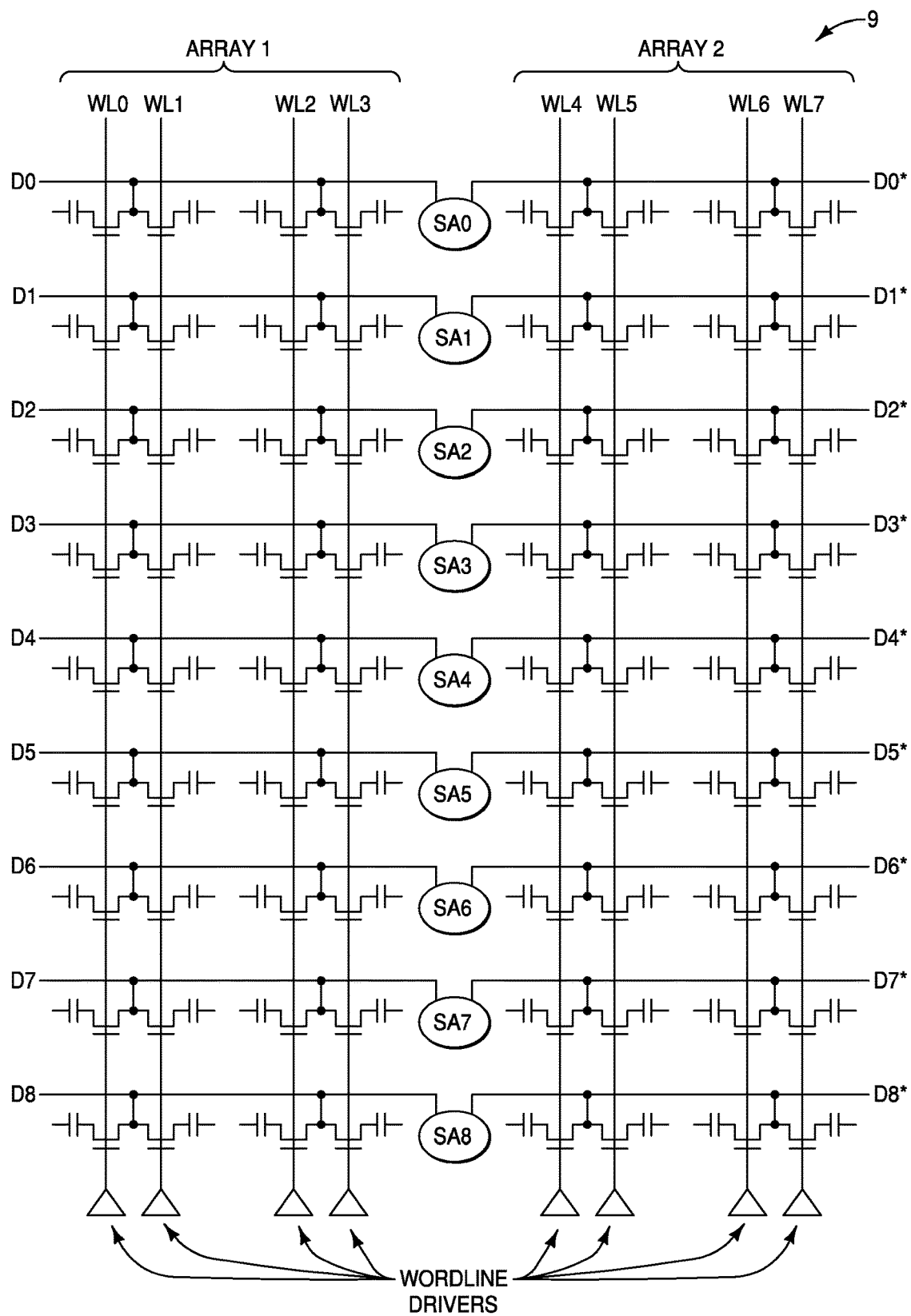
FIG. 3 is a schematic diagram of a prior art integrated assembly having open bitline architecture.

Operation of DRAM (e.g., the conventional DRAM of FIG. 3) utilizes the sense amplifiers for reading to and writing from the memory cells, as well as for refreshing the memory cells. The data state of a DRAM cell may correspond to a charge state of the capacitor within the memory cell. If the capacitor is charged, the memory cell is in one memory state; and if the capacitor is not charged, the memory cell is in a different memory state. The refreshing is required because the capacitors discharge over time, and thus the memory cells will lose data unless the charge state of the capacitors is periodically restored.

The digit lines of a memory array may be considered to extend along columns of the memory array, and the wordlines may be considered to extend along rows of the memory array. The refreshing of the memory cells may comprise activating a wordline to trigger all of the memory cells along a row. The data from the triggered memory cells is placed on the digit lines associated with the memory cells. The digit lines extend to the sense amplifiers (as shown in the conventional DRAM of FIG. 3). The sense amplifiers pull the data signals to a full level (ground or VCC), and such full level charge is then returned to the memory cells.

The sense amplifiers are also utilized for reading to and writing from the memory cells. Such operations comprise triggering individual memory cells to either provide content to the memory cells (during a write operation), or to ascertain the content of the memory cells (during a read operation). The reading and writing operations may require more complex operations of the sense amplifiers than do the refresh operations. Some embodiments include the addition of supplemental sense amplifiers along the columns of a DRAM array, with such supplemental sense amplifiers being utilized only during refresh operations. The supplemental sense amplifiers may be referred to as secondary-sense-amplifiers. The main sense amplifiers remain as primary-sense-amplifiers to be utilized during read/write operations. The secondary-sense-amplifiers may have a simpler circuit design as compared to the primary-sense-amplifiers, and thus may consume less semiconductor real estate. The secondary-sense-amplifiers break the digit lines into short segments during a refresh operation which may increase available signal, and thereby decrease the refresh period and save power. The timing performance of the refresh cycle may also be enhanced. In some embodiments, the primary-sense-amplifiers and secondary-sense-amplifiers may be provided under the memory arrays, which may enable fabrication of highly-integrated architectures. Example embodiments are described with reference to FIGS. 4, 4A, 5A, 5B, 6A, 6B, 7A, 7B, and 8-11.

Figure 4:
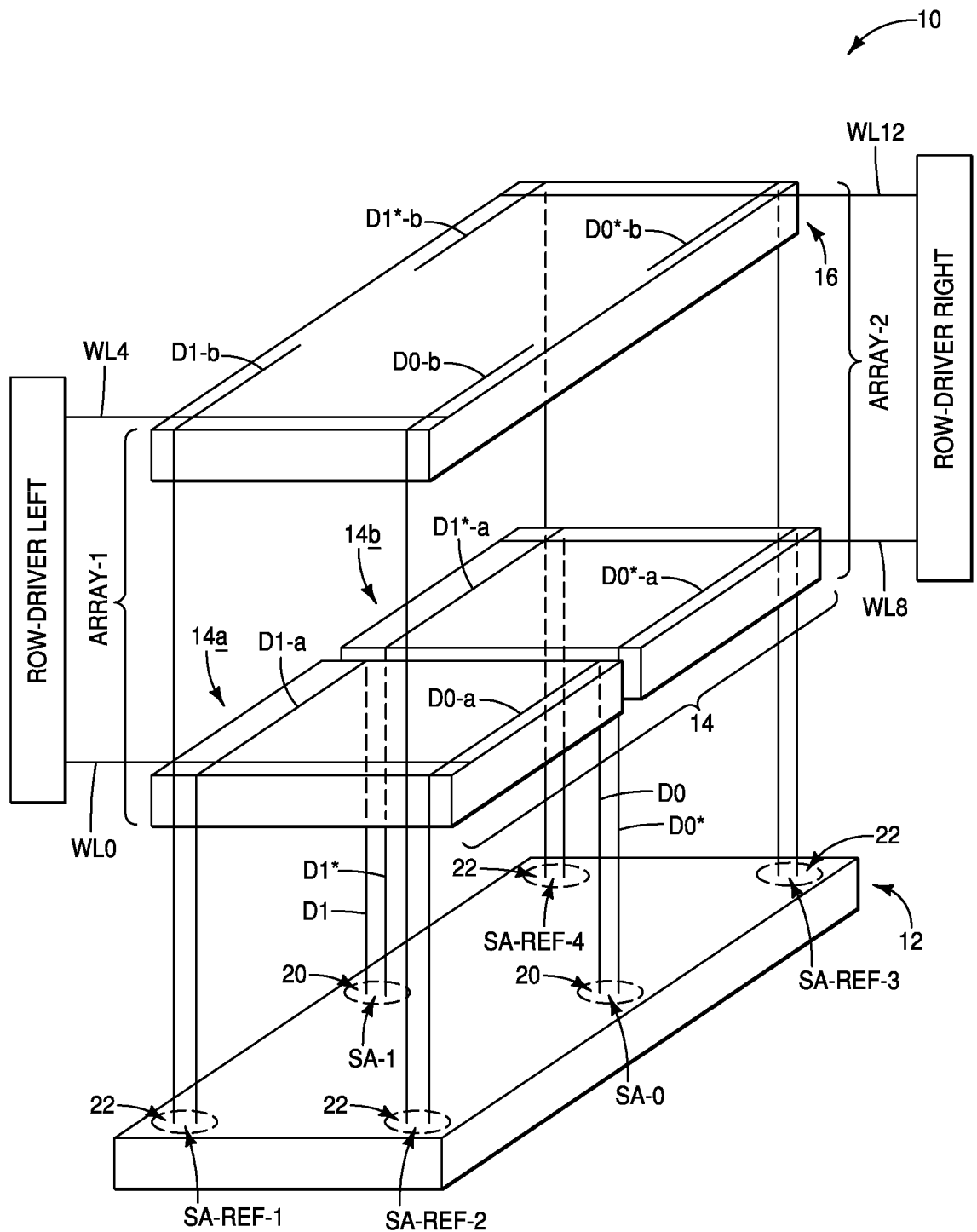
FIG. 4 is a schematic three-dimensional diagram of an example integrated assembly having multiple decks which are vertically displaced relative to one another.

Referring to FIG. 4, an integrated assembly 10 includes a base 12, a first deck 14 over the base, and a second deck 16 over the first deck. The second deck 14 comprises a first segment 14a and a second segment 14b.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc. Each of the decks 14 and 16 may also comprise semiconductor material.

A first memory array (Array-1) is along one side of the first and second decks 14 and 16, and a second memory array (Array-2) is along another side of the first and second decks. Digit lines D0 and D1 extend along columns of the first memory array, and digit lines D0* and D1* extend along columns of the second memory array. Wordlines WL0 and WL4 extend along rows of the first memory array, and wordlines WL8 and WL12 extend along rows of the second memory array. The illustrated wordlines and digit lines are representative of large numbers of substantially identical wordlines and digit lines which may extend across the memory arrays (with the term "substantially identical" meaning identical to within reasonable tolerances of fabrication and measurement). The memory arrays may comprise hundreds, thousands, millions, etc., of substantially identical memory cells; and such memory cells may each be uniquely addressed utilizing one of the digit lines and one of the wordlines. Accordingly, there may be hundreds, thousands, millions, etc., of wordlines and digit lines associated with the memory arrays. The individual memory cells are not shown in FIG. 4, but example memory cells are described below with reference to FIGS. 5A, 5B, 6A, 6B, 7A, 7B and 8.

Referring still to FIG. 4, the wordlines WL0, WL4, WL8 and WL12 are coupled with wordline drivers; with one of the drivers being labeled as a Row-Driver Left, and the other being labeled as a Row-Driver Right. The Row-Driver Left drives the wordlines along the first memory array (Array-1), and the Row-Driver Right drives the wordlines along the second memory array (Array-2).

Figure 11:
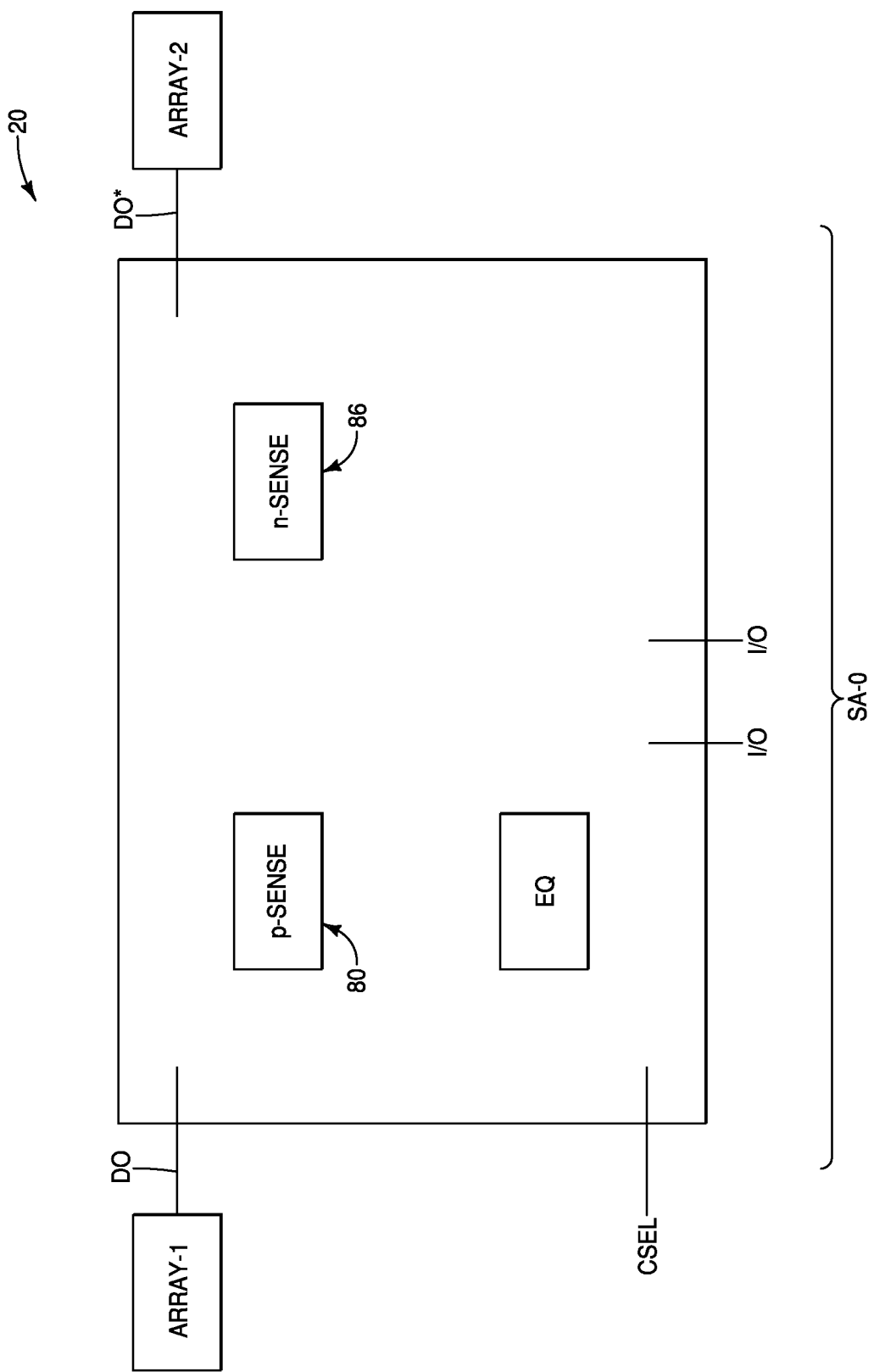

The digit line D0 is comparatively coupled with the digit line D0* through a primary-sense-amplifier SA-0, and the digit line D1 is comparatively coupled with the digit line D1* through a primary-sense-amplifier SA-1. The primary-sense-amplifiers SA-0 and SA-1 are both identified with the label 20, and may be referred to herein as sense amplifiers 20, or as sense-amplifier-circuitries 20. For purposes of understanding this disclosure and the claims that follow, a first digit line is "comparatively coupled" with a second digit line through a sense-amplifier-circuitry if the sense-amplifier-circuitry is configured to compare electrical properties (e.g., voltage) of the first and second digit lines with one another. FIG. 11 (below) shows an example primary-sense-amplifier SA-0, and shows an example application in which digit lines D0 and D0* are comparatively coupled through the example primary-sense-amplifier.

Each of the digit lines of FIG. 4 comprises a first portion along the first deck 14, and a second portion along the second deck 16. Specifically, the digit line D0 comprises a first portion D0-a along the first deck 14, and a second portion D0-b along the second deck 16. Similarly, the digit lines D0*, D1 and D1* comprise first portions D0*-a, D1-a and D1*-a along the first deck 14, and comprise second portions D0*-b, D1-b and D1*-b along the second deck 16. In some embodiments, the second portions of the digit lines may be considered to be vertically offset relative to the first portions of the digit lines. The digit lines extend along columns of the memory arrays (Array-1 and Array-2), and accordingly such columns of the memory arrays may be understood to have first portions along the first deck 14, and to have second portions along the second deck 16.

In the shown embodiment, the first portions of the digit lines (e.g., the portion D0-a of the digit line D0) are comparatively coupled to the second portions of the digit lines (e.g., the portion D0-b of the digit line D0) through secondary-sense-amplifiers. The secondary-sense-amplifiers are labeled as SA-REF-1, SA-REF-2, SA-REF-3 and SA-REF-4; with the term "REF" being utilized to emphasize that the secondary-sense-amplifiers may be utilized exclusively for refresh operations. The secondary-sense-amplifiers SA-REF-1, SA-REF-2, SA-REF-3 and SA-REF-4 are all identified with the label 22; and may be referred to as sense amplifiers 22, or as sense-amplifier-circuitries 22.

The sense-amplifier-circuitries 20 and 22 may comprise any suitable configurations. An example sense-amplifier-circuitry 20 is diagrammatically illustrated in FIG. 11, and example sense-amplifier-circuitries 22 are diagrammatically illustrated in FIGS. 9 and 10. Dashed-lines are provided in FIG. 4 to show approximate boundaries of the sense-amplifier-circuitries. In the shown embodiment, the primary-sense-amplifiers 20 are along the base 12, and the secondary-sense-amplifiers 22 are also along such base; with the primary-sense-amplifiers 20 being laterally between the secondary-sense-amplifiers 22. In some embodiments, at least a portion of the amplifier circuitries may be provided directly under the memory arrays to enable a tight packing density to be achieved.

FIG. 4 shows an embodiment in which the top deck 16 has a different configuration than the underlying deck 14. Specifically, the deck 14 is split amongst two portions 14a and 14b, while the deck 16 is one continuous expanse. In other embodiments, the upper deck 16 may be split similarly to the underlying deck 14, as shown in FIG. 4A.

Figure 4A:
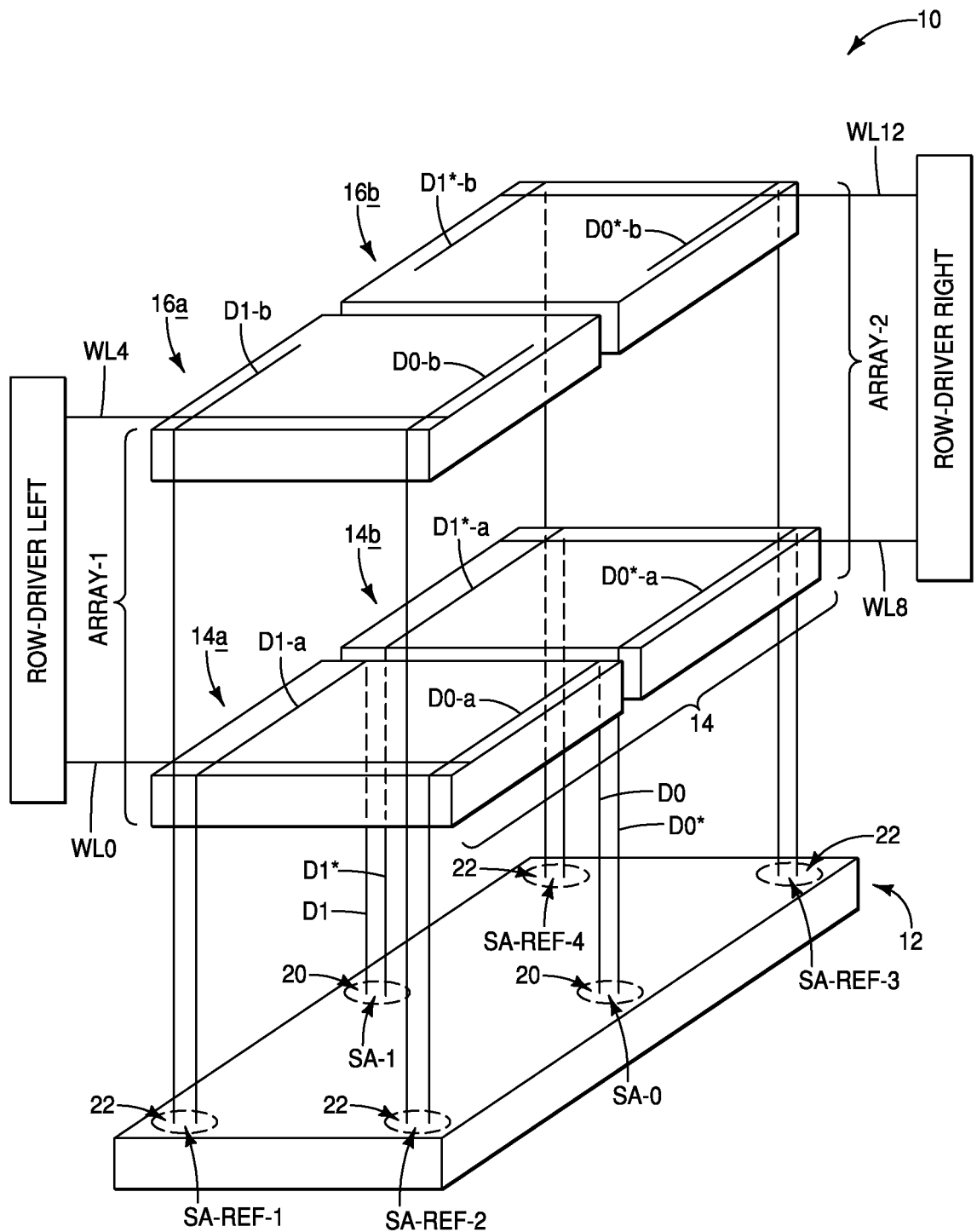
FIG. 4A is a schematic three-dimensional diagram of an example integrated assembly having multiple decks which are vertically displaced relative to one another.

The memory arrays (Array-1 and Array-2) of FIGS. 4 and 4A may comprise any suitable memory cells. Example configurations of such memory arrays are described with reference to FIGS. 5A, 5B, 6A, 6B, 7A and 7B and 8.

Figure 5A:
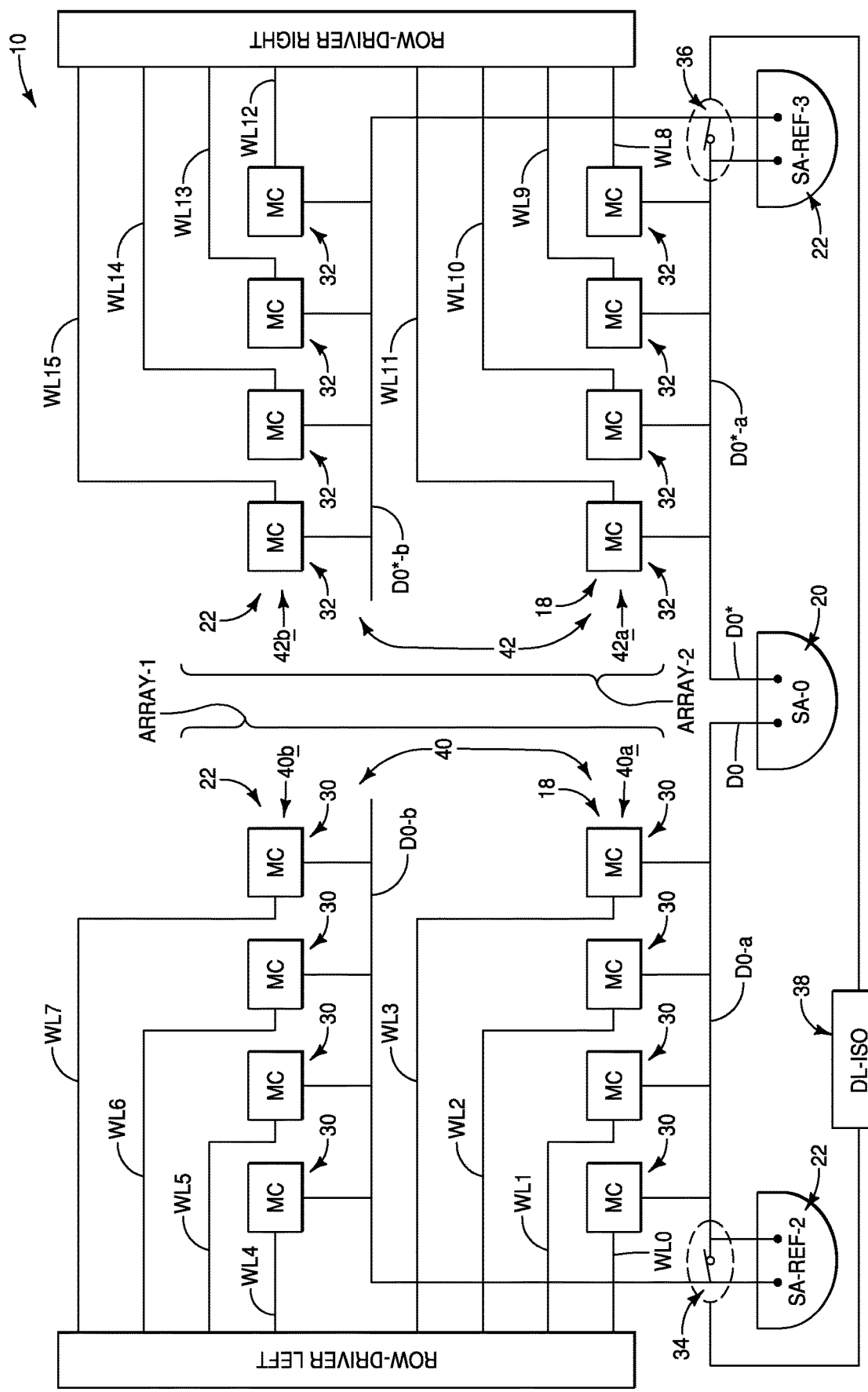
FIGS. 5A and 5B are diagrammatic side views showing example arrangements of circuit components.

Referring to FIG. 5A, memory cells of the memory arrays Array-1 and Array-2 are labeled as MC.

FIG. 5A specifically shows a portion of the integrated assembly 10 comprising regions of the first memory array (Array-1) and the second memory array (Array-2) along the digit lines D0 and D0*. The digit lines D0 and D0* may be referred to as first and second digit lines, respectively. The memory cells MC along the first digit line D0 are labeled as first memory cells 30, and are arranged in a first column 40; with the digit line D0 extending along such first column. The memory cells MC along the second digit line D0* are labeled as second memory cells 32, and are arranged in a second column 42; with the digit line D0* extending along such second column. Each of the memory cells 30 of the first memory array (Array-1) is uniquely addressed by the digit line D0 and one of the illustrated wordlines (WL0-WL7). Each of the memory cells 32 of the second memory array (Array-2) is uniquely addressed by the digit line D0* and one of the illustrated wordlines (WL8-WL15). The digit lines D0 and D0* are comparatively coupled to one another through the primary-sense-amplifier SA-0.

The first digit line D0 is subdivided into the portions D0-a and D0-b; and the first column 40 may be considered to be similarly subdivided into a first portion 40a and a second portion 40b. The first portion 40a of the first column 40 is associated with the first portion D0-a of the digit line D0, and the second portion 40b of the first column 40 is associated with the second portion D0-b of the digit line D0.

The second digit line D0* is subdivided into the portions D0*-a and D0*-b; and the second column 42 may be considered to be similarly subdivided into a first portion 42a and a second portion 42b. The first portion 42a of the second column 42 is associated with the first portion D0*-a of the digit line D0*, and the second portion 42b of the second column 42 is associated with the second portion D0*-b of the digit line D0*.

The first and second portions D0-a and D0-b of the first digit line D0 are coupled to one another. The coupling may be through a first switch 34 or through the secondary-sense-amplifier 22 (SA-REF-2) depending on the operational mode of the switch 34. Similarly, the first and second portions D0*-a and D0*-b of the second digit line D0* are coupled to one another through either a second switch 36 or the secondary-sense-amplifier 22 (SA-REF-3) depending on the operational mode of the switch 36. FIG. 5A shows an operational mode in which the switches 34 and 36 are in closed configurations, and accordingly electrical signals along the columns 40 and 42 are shunted past the secondary-sense-amplifiers 22. The operational mode of FIG. 5A effectively removes the secondary-sense-amplifiers 22 from influencing electrical flow along the columns 40 and 42. Accordingly, the primary-sense-amplifier 20 may be utilized for accessing all of the memory cells associated with the first and second columns 40 and 42 of Array-1 and Array-2; and may be utilized for read/write operations associated with the first and second columns 40 and 42.

The switches 34 and 36 are shown to be controlled by isolation circuitry 38, which is labeled as DL-ISO; and which may be referred to as digit line isolation circuitry, or as a digit line isolation driver.

The switches 34 and 36 may have any suitable configurations, and in some embodiments may correspond to transistors; as described in more detail below with reference to FIGS. 9 and 10. The switches 34 and 36 are representative of switches which may be associated with each of the secondary-sense-amplifier circuitries 22. Such switches may be in any suitable locations, and in some embodiments may be along the base 12 of FIG. 4. In some embodiments, at least portions of the switches (e.g., 34 and 36) may be directly under the memory arrays to enable tight packing. In some embodiments, the entireties of all of the switches (e.g., 34 and 36) may be directly under the memory arrays to enable tight packing.

Figure 5B:
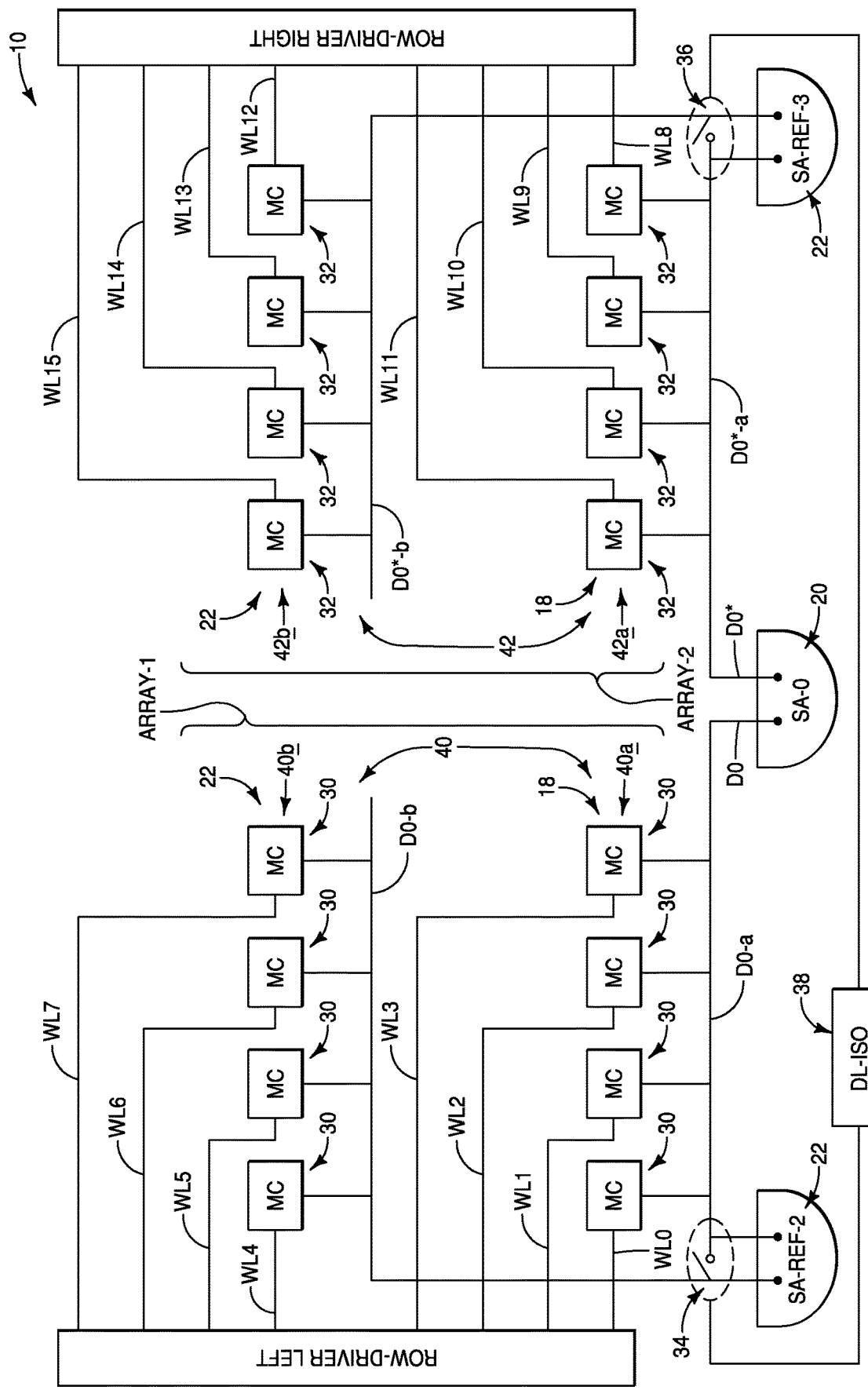

FIG. 5B shows an operational mode in which the switches 34 and 36 are in an open configuration. Accordingly, the first portion D0-a of the first digit line D0 is comparatively coupled to the second portion D0-b through the secondary-sense amplifier SA-REF-2, and the first portion D0*-a of the second digit line D0* is comparatively coupled to the second portion D0*-b through the secondary-sense amplifier SA-REF-3. In some embodiments, the secondary-sense-amplifiers SA-REF-2 and SA-REF-3 may be referred to as first and second secondary-sense-amplifiers, respectively. The operational mode of FIG. 5B may be utilized for refreshing the memory cells along the columns 40 and 42.

The utilization of the secondary-sense-amplifiers 22 for the refreshing of the memory cells MC may utilize any suitable programming operations. For instance, in some embodiments the primary-sense-amplifier 20 may be utilized to initially pre-charge the first and second digit lines D0 and D0* while the switches 34 and 36 are in the closed configuration of FIG. 5A; the driver 38 may be utilized to then change the switches 34 and 36 to the open configuration of FIG. 5B; and then the secondary-sense-amplifiers 22 and the Row-Drivers may be utilized during a refresh operation. In some embodiments (not shown) the columns 40 and 42 may be configured so that the primary-sense-amplifier 20 may also be utilized during the refresh operation.

In some embodiments, the configurations of FIGS. 5A and 5B may be considered to correspond to first and second operations, respectively, performed along the columns 40 and 42.

FIGS. 5A and 5B show operations along a single column from Array-1 and a single column along Array-2. Identical operations may be performed along all of the other columns of the memory arrays.

Figure 1:
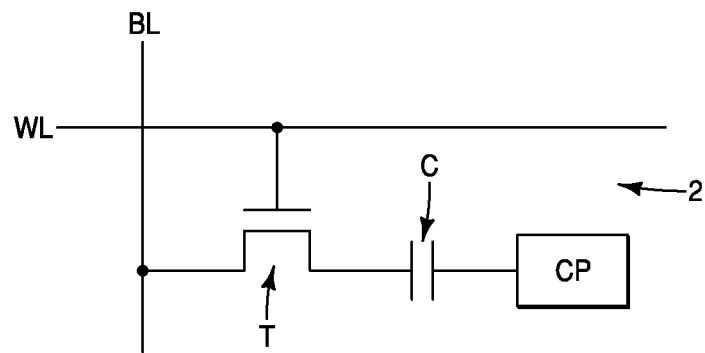
FIG. 1 is a schematic diagram of a prior art memory cell having 1 transistor and 1 capacitor.
Figure 2:
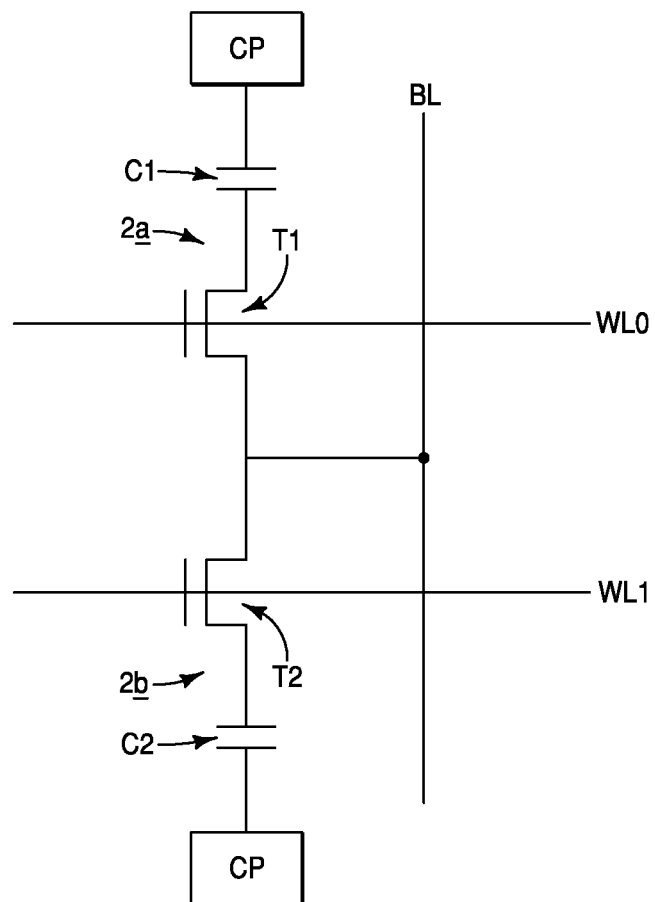
FIG. 2 is a schematic diagram of a pair of prior art memory cells which each have 1 transistor and 1 capacitor, and which share a bitline connection.
Figure 6A:
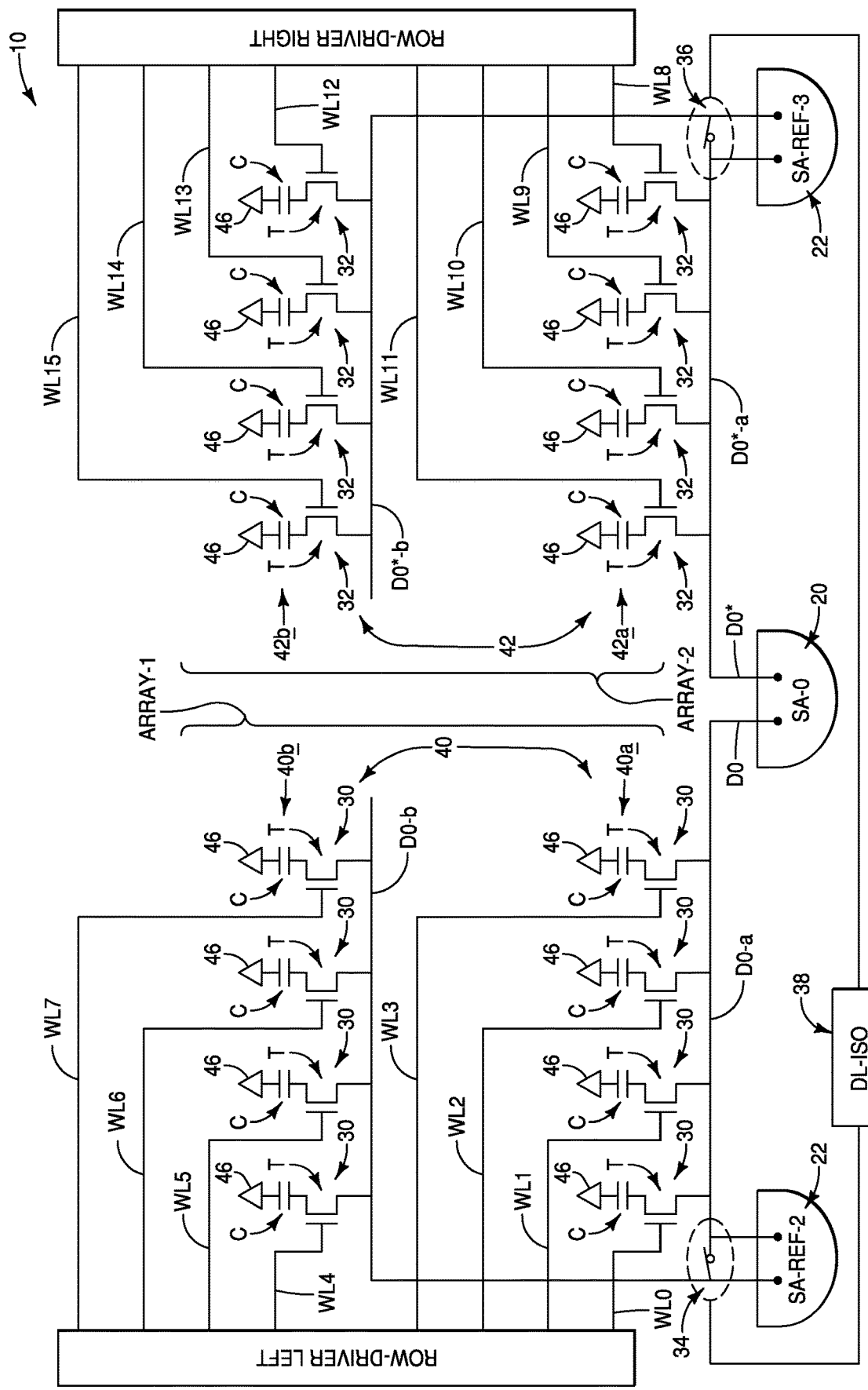
FIGS. 6A and 6B are diagrammatic side views showing example arrangements of circuit components.
Figure 6B:
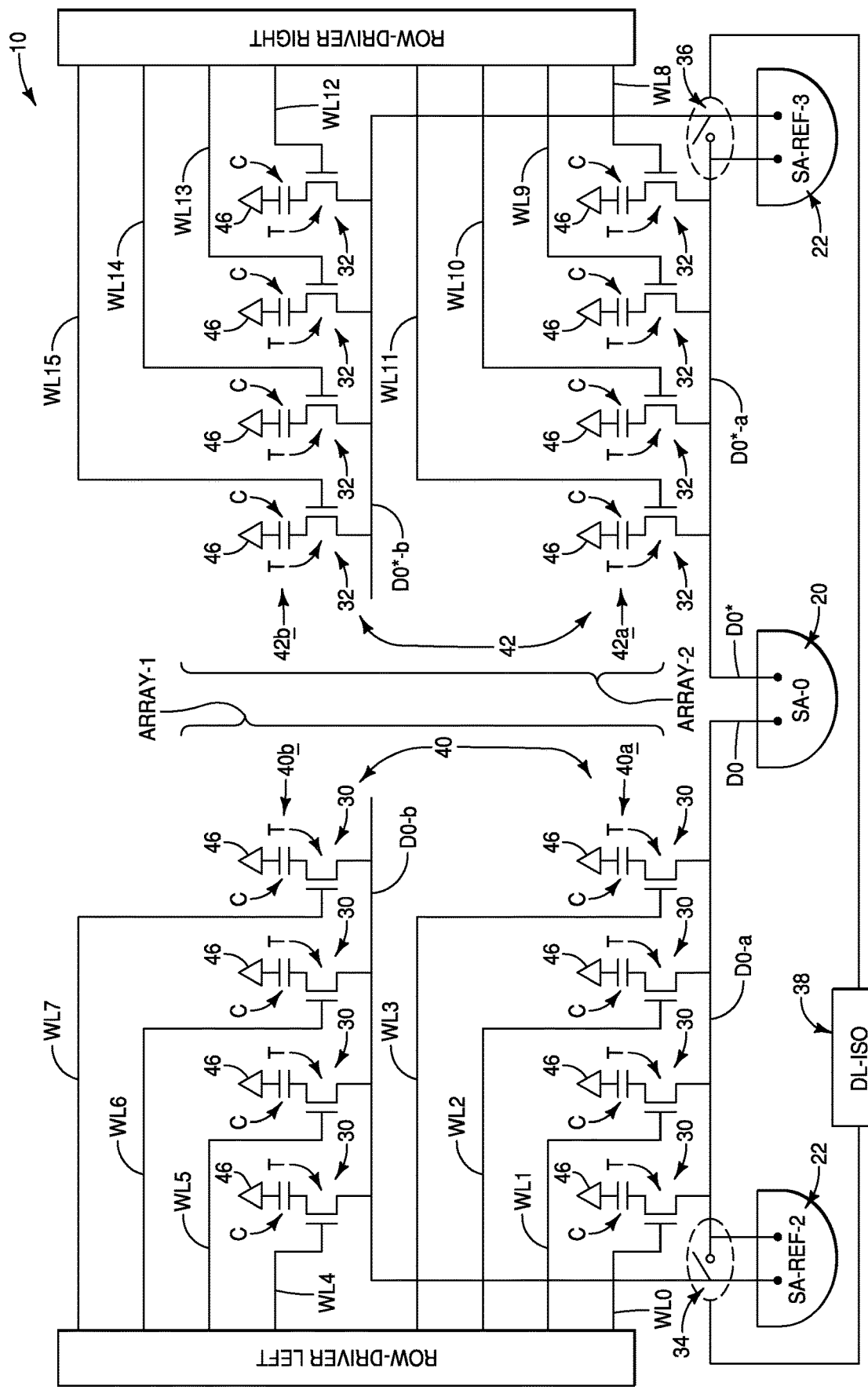

Referring to FIGS. 6A and 6B, the example memory cells 30 and 32 are shown in more detail than in FIGS. 5A and 5B. Each of the example memory cells 30 and 32 includes a transistor T coupled with a capacitor C. Each capacitor has a node coupled with a reference voltage 46. The reference voltage 46 may correspond to the common plate (CP) voltage described above with reference to FIG. 1. The illustrated memory cells of FIGS. 6A and 6B are 1T-1C memory cells. In other embodiments, other memory cells may be utilized. The capacitors of the illustrated memory cells 30 and 32 are example charge-storage devices, and in other embodiments other suitable charge-storage devices (e.g., phase-change devices, conductive-bridging devices, etc.) may be utilized.

Figure 7A:
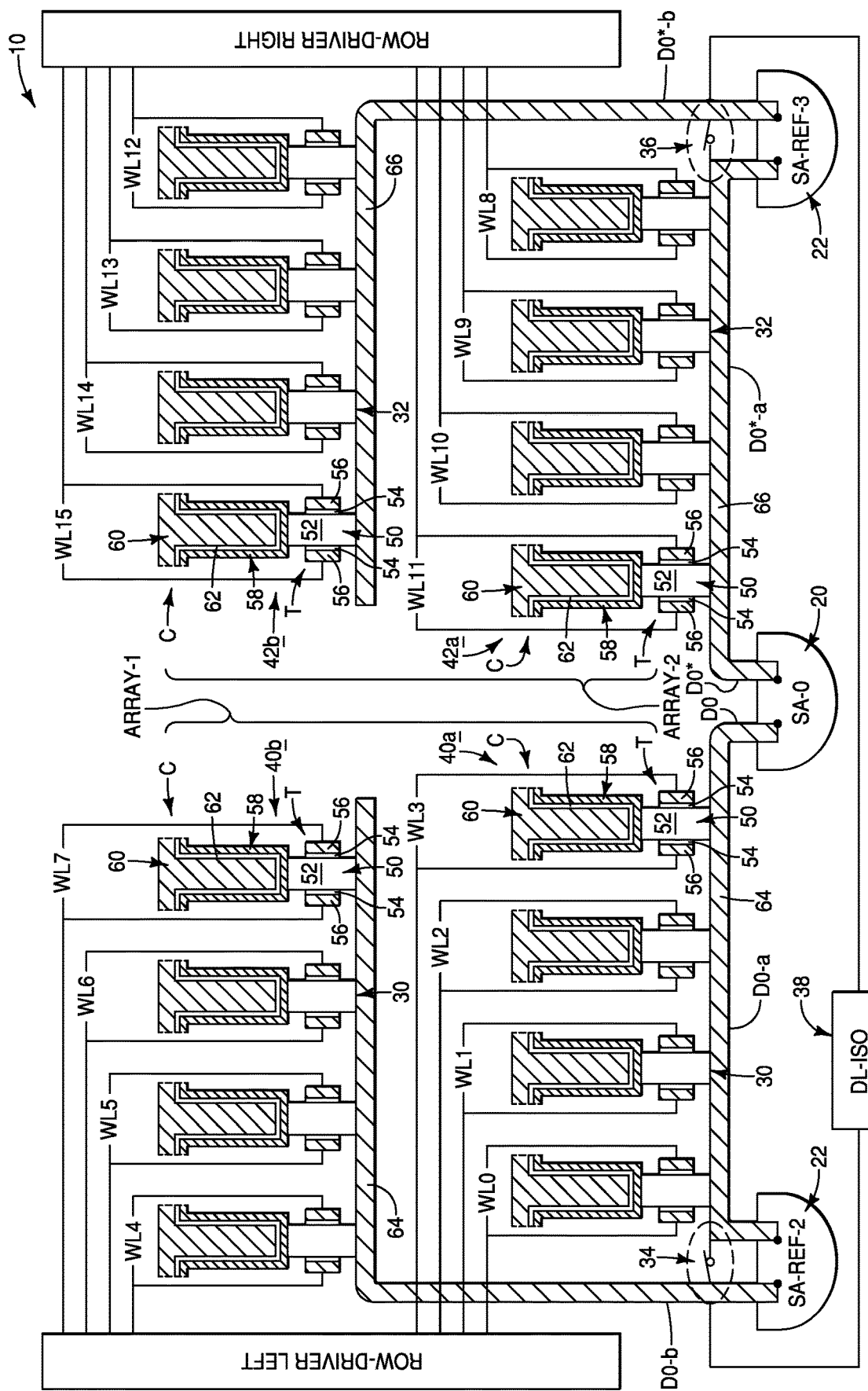
FIGS. 7A and 7B are diagrammatic side views showing example arrangements of circuit components.
Figure 7B:
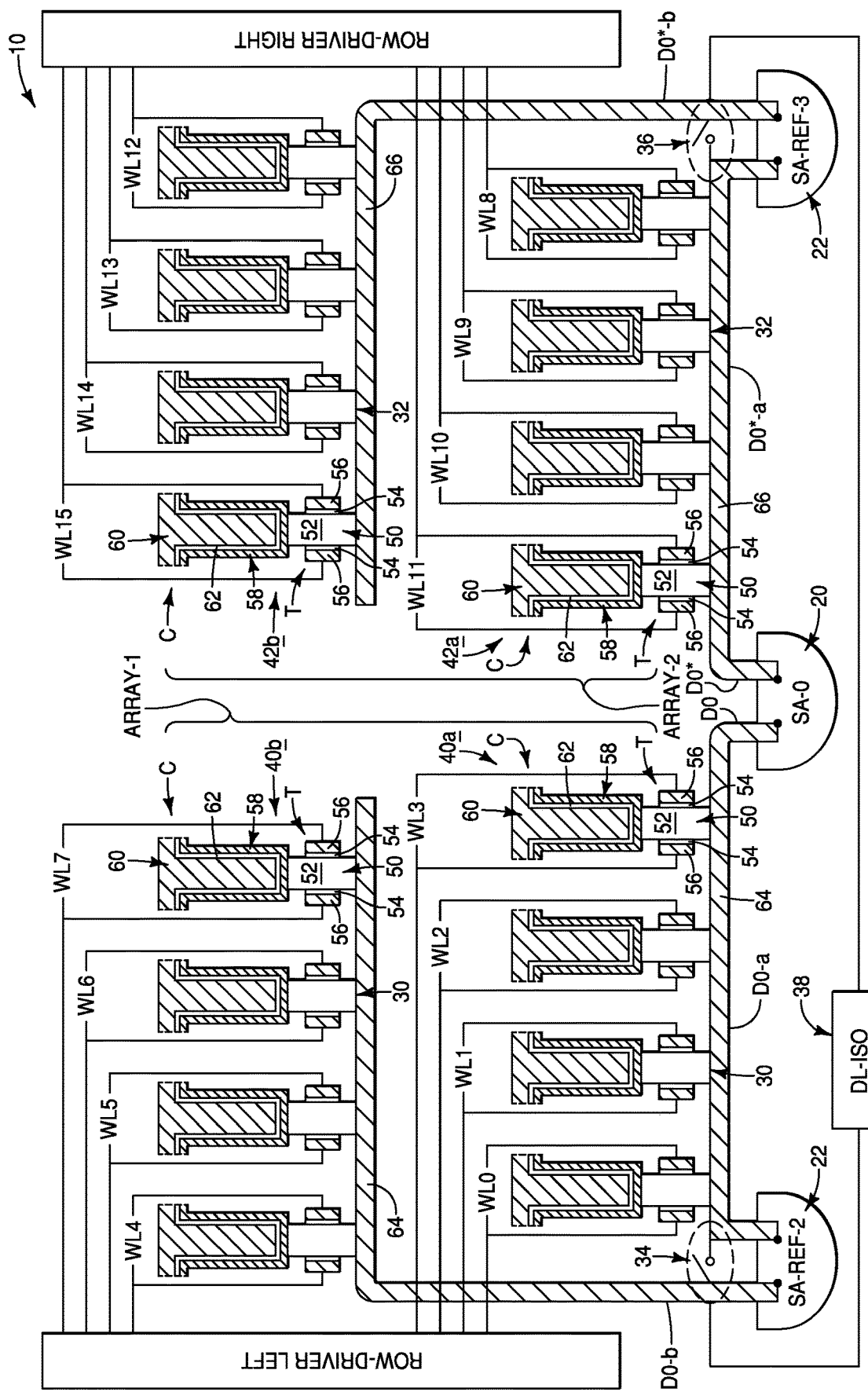

Referring to FIGS. 7A and 7B, the example memory cells 30 and 32 are shown in more detail than in FIGS. 6A and 6B. The transistors T are shown to comprise vertically-extending pillars 50 of semiconductor material 52. The semiconductor material 52 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). Source/drain and channel regions (not shown) may be provided within the pillars 50. Gate dielectric material 54 is along sidewalls of the pillars, and conductive gate material 56 is along the gate dielectric material. The gate dielectric material may comprise any suitable composition(s); and in some embodiments may comprise, consist essentially of, or consist of silicon dioxide. The gate material 56 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The capacitors C comprise first conductive nodes 58, second conductive nodes 60, and insulative material 62 between the first and second conductive nodes. The first and second conductive nodes 60 and 62 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The first and second conductive nodes may comprise the same composition as one another, or may comprise different compositions relative to one another. The insulative material 62 may comprise any suitable composition(s), and in some embodiments may comprise, consist essentially of, or consist of silicon dioxide.

In the shown embodiment, the lower conductive nodes 58 are configured as upwardly-opening containers. In other embodiments, the lower conductive nodes may have other suitable shapes. The lower conductive nodes 58 may be referred to as storage nodes, and the upper nodes 60 may be referred to as plate electrodes. In some embodiments, the plate electrodes within Array-1 may all be coupled to one another, and the plate electrodes within Array-2 may also all be coupled to one another.

The digit lines D0 and D0\* are shown to comprise conductive materials 64 and 66, respectively. Such conductive materials may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials 64 and 66 may be the same composition as one another in some embodiments, or may be different compositions.

Figure 8:
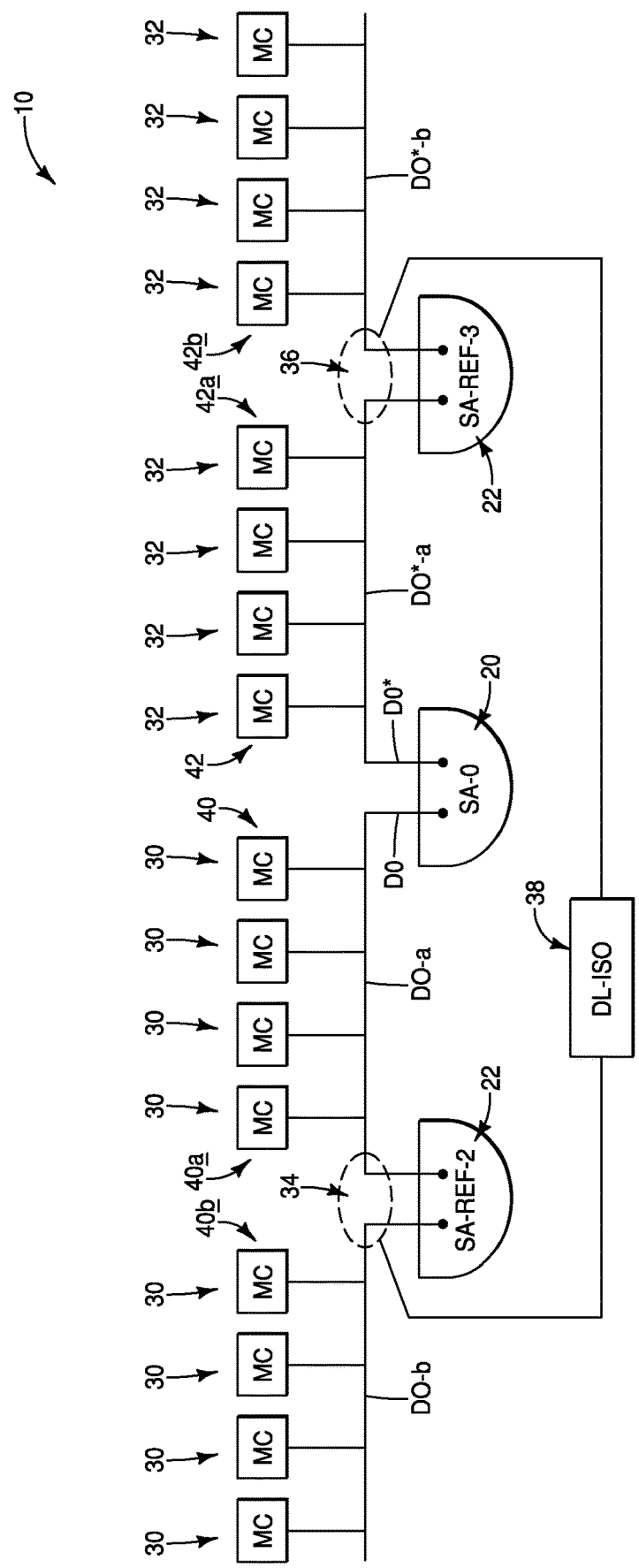
FIG. 8 is a diagrammatic side view showing an example arrangement of circuit components.

The embodiments of FIGS. 4, 4A, 5A, 5B, 6A, 6B, 7A and 7B show each of the digit lines having a second portion which is at a different elevational level then a first portion (for instance, digit line D0 has the second portion D0-*b* at a different elevational level than the first portion D0-*a*). In other embodiments, the first and second portions of the digit lines may be at a same elevational level as one another. For instance, FIG. 8 shows a region of an integrated assembly 10 similar to that of FIGS. 5A and 5B, but in which the digit lines D0 and D0\* extend horizontally along a single elevational level. Accordingly, the first and second portions D0-*a* and D0-*b* of the digit line D0 are along a same elevational level as one another, and the first and second portions D0\*-*a* and D0\*-*b* of the digit line D0\* are along a same elevational level as one another. The wordlines and wordline drivers are not shown in FIG. 8 in order to simplify the drawing, but may be analogous to those shown in FIGS. 5A and 5B. The switches 34 and 36 are generically illustrated in FIG. 8 without showing whether the switches are in an open configuration or a closed configuration. The switches 34 and 36 may be operated analogously to those described above with reference to FIGS. 5A and 5B.

The secondary-sense-amplifiers 22 of FIGS. 4, 4A, 5A, 5B, 6A, 6B, 7A, 7B and 8 may have any suitable configurations. Example embodiments of secondary-sense-amplifiers 22 (specifically, the secondary-sense-amplifiers SA-REF-2 and SA-REF-3) are described with reference to FIGS. 9 and 10.

The secondary-sense-amplifiers 22 include a p-sense amplifier 80 comprising a pair of cross-coupled pull-up transistors 82 and 84, and include an n-sense amplifier 86 comprising a pair of cross-coupled pull-down transistors 88 and 90. The p-sense amplifier 80 is coupled with active pull-up circuitry (labeled ACT), and the n-sense amplifier 86 is coupled with a common node (labeled RNL).

Figure 9:
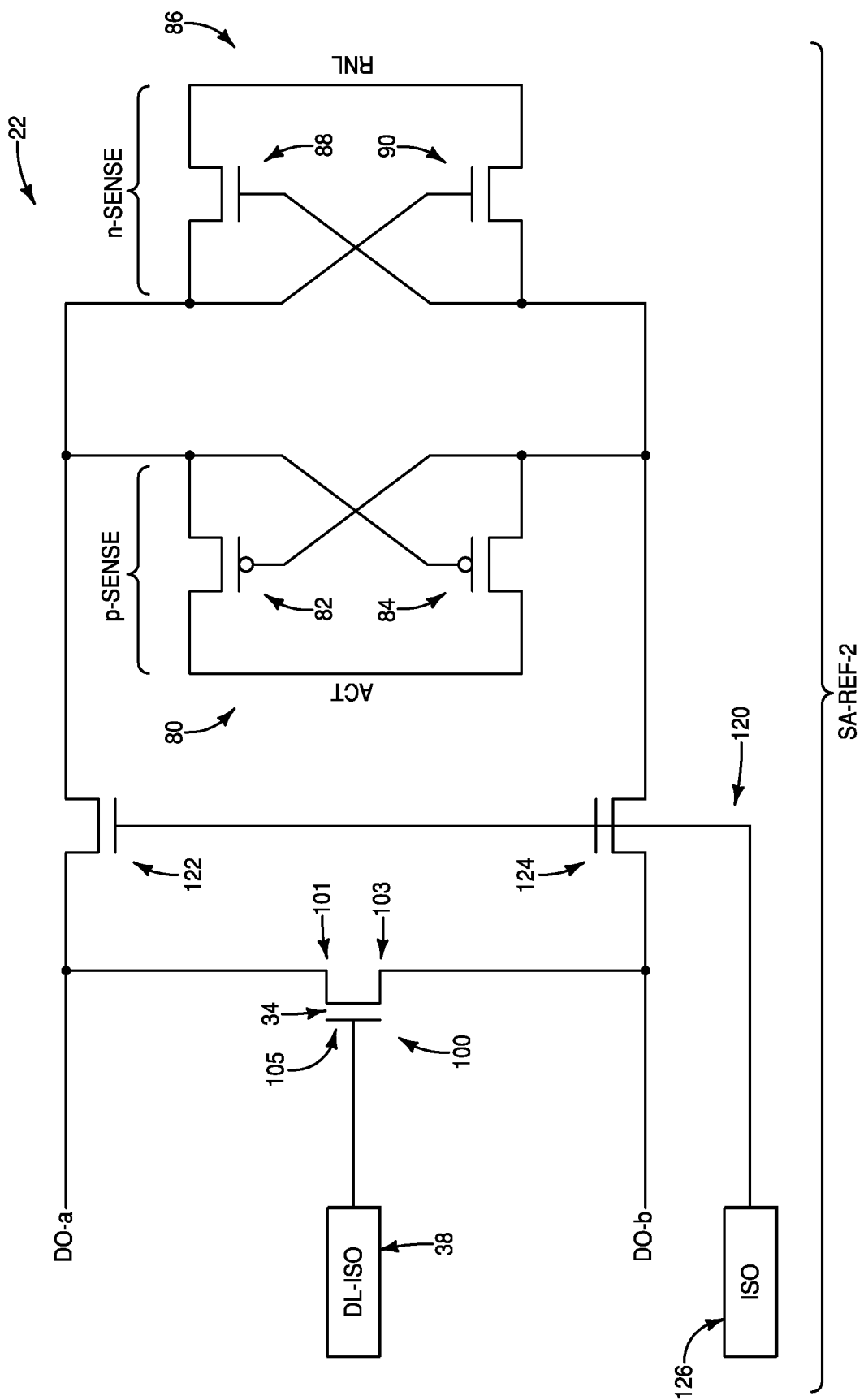
FIGS. 9-11 are diagrammatic schematic diagrams of example sense-amplifier-circuitries.

The secondary-sense-amplifier SA-REF-2 of FIG. 9 is coupled with the first and second digit line portions D0-*a* and D0-*b*; or in other words, the digit line portions D0-*a* and D0-*b* are comparatively coupled with one another through the illustrated secondary-sense-amplifier SA-REF-2. In operation, the amplifiers 80 and 86 may be utilized together to detect the relative signal voltages of D0-*a* and D0-*b*, and to drive the higher signal voltage to VCC while driving the lower signal voltage to ground.

Figure 10:
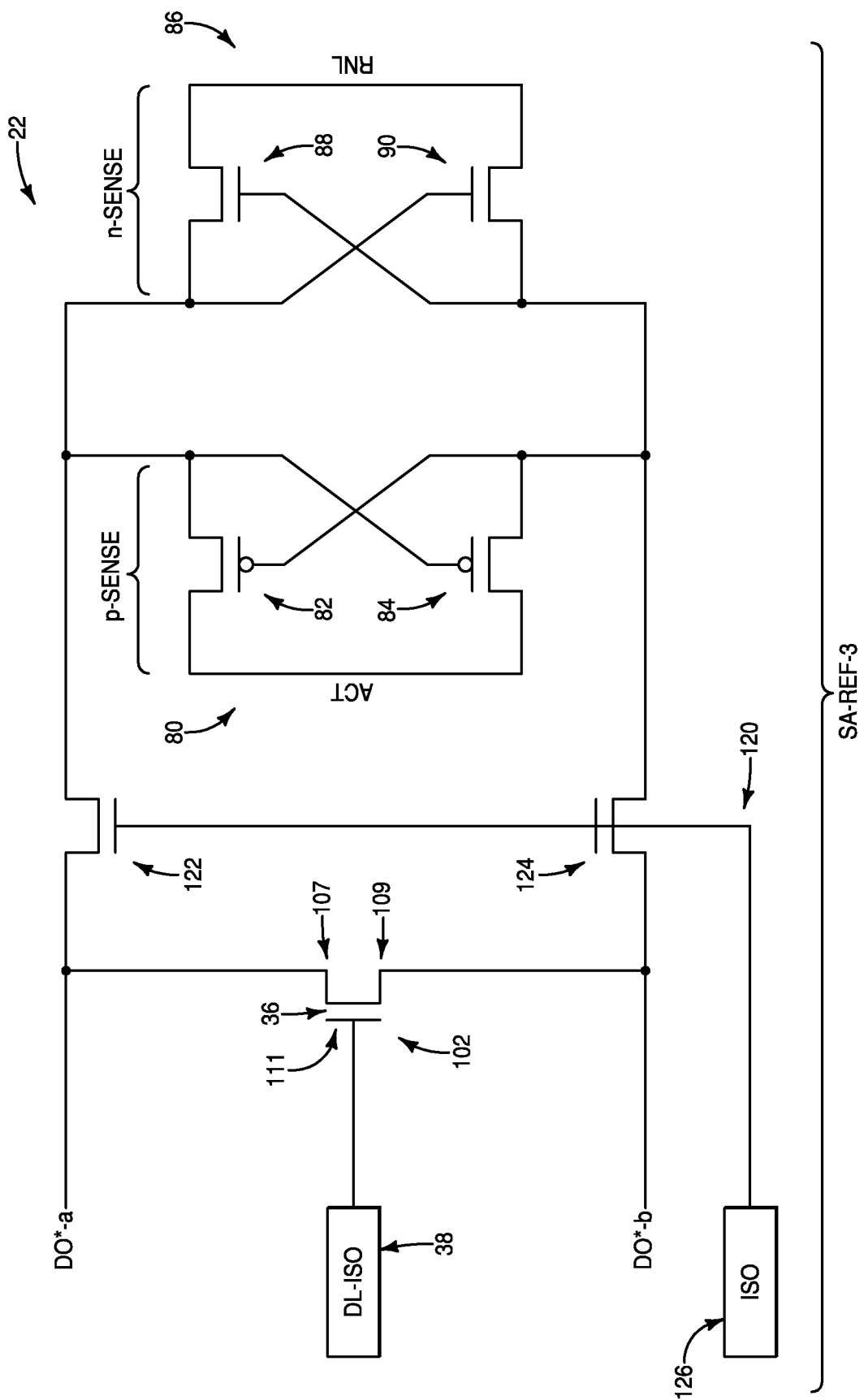

The secondary-sense-amplifier SA-REF-3 of FIG. 10 is coupled with the first and second digit line portions D0\*-*a* and D0\*-*b* in a manner analogous to that in which the secondary-sense-amplifier SA-REF-2 of FIG. 9 is coupled with the first and second digit line portions D0-*a* and D0-*b*

The switches 34 and 36 of FIGS. 9 and 10 are illustrated to be first and second transistors 100 and 102, respectively. The first transistor 100 has a first source/drain region 101 coupled to the first portion D0-*a* of the first digit line D0, and has a second source/drain region 103 coupled to the second portion D0-*b* of the first digit line. The transistor 100 also comprises a gate 105 which is electrically coupled with the isolation driver 38. The second transistor 102 has a first source/drain region 107 coupled to the first portion D0\*-*a* of the second digit line D0\*, and has a second source/drain region 109 coupled to the second portion D0\*-*b* of the second digit line. Additionally, the second transistor 102 comprises a gate 111 which is coupled with the isolation driver 38. In some embodiments, the gate 105 of the first transistor 100 may be referred to as a first gate, and the gate 111 of the second transistor 102 may be referred to as a second gate.

In the illustrated embodiment, the secondary-sense-amplifiers 22 comprise additional isolation circuitry 120 which includes a pair of transistors 122 and 124, and an isolation driver 126 (labeled ISO). The isolation circuitry 120 enables the ACT and RNL circuitry to be shared amongst the secondary-sense-amplifiers, in that each of the amplifiers may be isolated when not in use. In some embodiments, the isolation circuitry 120 may be omitted, and in such embodiments individual ACT and RNL devices may be associated with each of the secondary-sense-amplifiers.

The primary-sense-amplifiers 20 of FIGS. 4, 4A, 5A, 5B, 6A, 6B, 7A, 7B and 8 may have any suitable configuration. An example embodiment of a primary-sense-amplifier 20 (specifically, the primary-sense-amplifiers SA-0) is described with reference to FIG. 11.

The primary-sense-amplifier 20 includes the p-sense amplifier 80 and n-sense amplifier 86 described above with reference to FIGS. 9 and 10 (and shown more generically in FIG. 11 than in FIGS. 9 and 10). In operation the amplifiers 80 and 86 may be utilized together to detect the relative signal voltages of D0 and D0*, and to drive the higher signal voltage to VCC while driving the lower signal voltage to ground.

The primary-sense-amplifier 20 includes inputs and outputs (labeled as I/O) which may be utilized for exporting data regarding the relative signal voltages of D0 and D0*, and/or for programming memory cells along one or both of D0 and D0*; includes equilibration circuitry (labeled EQ) provided therein to balance electrical properties within the sense amplifier; includes column selection circuitry (labeled CSEL); and may include other components. Accordingly, the primary-sense-amplifier 20 of FIG. 11 is substantially more complex than the secondary-sense-amplifiers 22 of FIGS. 9 and 10. Such is due to the primary-sense-amplifier 20 being configured for read/write operations, while the secondary-sense-amplifiers 22 are configured only for refresh operations. Since the secondary-sense-amplifiers comprise fewer components than the primary-sense-amplifiers, the secondary-sense-amplifiers may be easier to fabricate than the primary-sense-amplifiers, and may be packed into tighter spaces than the primary-sense-amplifiers.

The embodiments of FIGS. 4, 4A, 5A, 5B, 6A, 6B, 7A, 7B and 8 subdivide each digit line into two portions utilizing the illustrated secondary-sense amplifiers, and thus effectively halve the digit lines during refresh operations. In other embodiments, additional secondary-sense-amplifiers may be provided so that the digit lines are subdivided into thirds, fourths, fifths, etc., during refresh operations.

The illustrated digit lines of FIGS. 5A, 5B, 6A, 6B, 7A, 7B and 8 comprise eight memory cells. In other embodiments, the digit lines may have more than eight memory cells, or fewer than eight memory cells. For instance, in some embodiments the digit lines may comprise 16 memory cells, 32 memory cells, 64 memory cells, etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first memory array which includes a first column of first memory cells. A first digit line extends along the first column of the first memory cells and is utilized to address the first memory cells of the first column. A second memory array is proximate to the first memory array and includes a second column of second memory cells. A second digit line extends along the second column of the second memory cells and is utilized to address the second memory cells of the second column. A primary-sense-amplifier comparatively couples the first digit line with the second digit line. The primary-sense-amplifier is configured to be utilized during reading from and writing to the first and second memory cells along the first and second columns. A first secondary-sense-amplifier is along the first digit line, and a second secondary-sense-amplifier is along the second digit line. The first and second secondary-sense-amplifiers are configured to be utilized only to refresh the first and second memory cells along the first and second digit lines.

Some embodiments include an integrated assembly having a first memory array comprising a first column of first memory cells. A first digit line extends along the first column of the first memory cells and is utilized to address the first memory cells of said first column. A second memory array is proximate to the first memory array and comprises a second column of second memory cells. A second digit line extends along the second column of the second memory cells and is utilized to address the second memory cells of said second column. A primary-sense-amplifier is configured to comparatively couple the first digit line with the second digit line. A first secondary-sense-amplifier is along the first digit line, and a first switch is between the first secondary-sense-amplifier and the first digit line. The first switch is configured to be closed during a first operation along the first column to shunt an electrical signal past the first secondary-sense-amplifier. The first switch is configured to be open during a second operation along the first column to enable the first secondary-sense-amplifier to comparatively couple a portion of the first digit line on one side of the first secondary-sense-amplifier with another portion of the first digit line on an opposing side of the first secondary-sense-amplifier. A second secondary-sense-amplifier is along the second digit line, and a second switch is between the second secondary-sense-amplifier and the second digit line. The second switch is configured to be closed during a first operation along the second column to shunt an electrical signal past the second secondary-sense-amplifier. The second switch is configured to be open during a second operation along the second column to enable the second secondary-sense-amplifier to comparatively couple a portion of the second digit line on one side of the second secondary-sense-amplifier with another portion of the second digit line on an opposing side of the second secondary-sense-amplifier.

Some embodiments include an integrated assembly having a base, a first deck over the base, and a second deck over the first deck. A first memory array comprises a first column of first memory cells. A first digit line extends along the first column of the first memory cells and is utilized to address the first memory cells of said first column. A first portion of the first column of the first memory cells is along the first deck and a second portion of the first column of the first memory cells is along the second deck. A second memory array is proximate to the first memory array and comprises a second column of second memory cells. A second digit line extends along the second column of the second memory cells and is utilized to address the second memory cells of said second column. A first portion of the second column of the second memory cells is along the first deck and a second portion of the second column of the second memory cells is along the second deck. A primary-sense-amplifier is configured to comparatively couple the first digit line with the second digit line. The primary-sense-amplifier is along the base. A first secondary-sense-amplifier is along the first digit line and is coupled to the first digit line through a first transistor. The first transistor has a first source/drain region coupled to a first portion of the first digit line, a second source/drain region coupled to a second portion of the first digit line, and a first gate coupled with an isolation driver. A second secondary-sense-amplifier is along the second digit line and is coupled to the second digit line through a second transistor; the second transistor has a third source/drain region coupled to a first portion of the second digit line, a second source/drain region coupled to a second portion of the second digit line, and a second gate coupled with the isolation driver.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
a first memory array comprising a first column of first memory cells;
a first digit line extending along the first column of the first memory cells and being utilized to address the first memory cells of said first column;
a second memory array proximate to the first memory array and comprising a second column of second memory cells, a first plurality of the first memory cells and a first plurality of the second memory cells being at a first elevation over a base, and a second plurality of the first memory cells and a second plurality of the second memory cells being at a second elevation over the base that differs from the first elevation;
a second digit line extending along the second column of the second memory cells and being utilized to address the second memory cells of said second column;
a primary-sense-amplifier which comparatively couples the first digit line with the second digit line; the primary-sense-amplifier being configured to be utilized during reading from and writing to the first and second memory cells along the first and second columns; and
a first secondary-sense-amplifier along the first digit line, and a second secondary-sense-amplifier along the second digit line; the first and second secondary-sense-amplifiers being configured to be utilized only to refresh the first and second memory cells along the first and second digit lines.

2. The integrated assembly of claim 1 wherein:
the primary-sense-amplifier and the secondary-sense-amplifiers are along the base;
a first deck is disposed over the base; a first portion of the first column of the first memory cells being along the first deck, and a first portion of the second column of the second memory cells being along the first deck; and
a second deck is disposed over the first deck; a second portion of the first column of the first memory cells being along the second deck, and a second portion of the second column of the second memory cells being along the second deck.

3. An integrated assembly, comprising:
a first memory array comprising a first column of first memory cells;
a first digit line extending along the first column of the first memory cells and being utilized to address the first memory cells of said first column;
a second memory array proximate to the first memory array and comprising a second column of second memory cells;
a second digit line extending along the second column of the second memory cells and being utilized to address the second memory cells of said second column;
a primary-sense-amplifier which comparatively couples the first digit line with the second digit line; the primary-sense-amplifier being configured to be utilized during reading from and writing to the first and second memory cells along the first and second columns; and
a first secondary-sense-amplifier along the first digit line, and a second secondary-sense-amplifier along the second digit line; the first and second secondary-sense-amplifiers being configured to be utilized only to refresh the first and second memory cells along the first and second digit lines;
a base; the primary-sense-amplifier and the secondary-sense-amplifiers being along the base;
a first deck over the base; a first portion of the first column of the first memory cells being along the first deck, and a first portion of the second column of the second memory cells being along the first deck; and
a second deck over the first deck; a second portion of the first column of the first memory cells being along the second deck, and a second portion of the second column of the second memory cells being along the second deck; wherein the first secondary-sense-amplifier is between the first portion of the first column of the first memory cells and the second portion of the first column of the first memory cells; and wherein the second secondary-sense-amplifier is between the first portion of the second column of the second memory cells and the second portion of the second column of the second memory cells.

4. The integrated assembly of claim 1 wherein the first and second memory cells comprise charge-storage devices in combination with transistors.

5. The integrated assembly of claim 1 wherein the first and second memory cells comprise capacitors in combination with transistors.

6. An integrated assembly, comprising:
a first memory array comprising a first column of first memory cells;
a first digit line extending along the first column of the first memory cells and being utilized to address the first memory cells of said first column;
a second memory array proximate to the first memory array and comprising a second column of second memory cells;
a second digit line extending along the second column of the second memory cells and being utilized to address the second memory cells of said second column;
a primary-sense-amplifier configured to comparatively couple the first digit line with the second digit line;
a first secondary-sense-amplifier along the first digit line, and a first switch between the first secondary-sense-amplifier and the first digit line; the first switch being configured to be closed during a first operation along the first column to shunt an electrical signal past the first secondary-sense-amplifier; the first switch being configured to be open during a second operation along the first column to enable the first secondary-sense-amplifier to comparatively couple a portion of the first digit line on one side of the first secondary-sense-amplifier with another portion of the first digit line on an opposing side of the first secondary-sense-amplifier; and
a second secondary-sense-amplifier along the second digit line, and a second switch between the second secondary-sense-amplifier and the second digit line; the second switch being configured to be closed during a first operation along the second column to shunt an electrical signal past the second secondary-sense-amplifier; the second switch being configured to be open during a second operation along the second column to enable the second secondary-sense-amplifier to comparatively couple a portion of the second digit line on one side of the second secondary-sense-amplifier with another portion of the second digit line on an opposing side of the second secondary-sense-amplifier.

7. The integrated assembly of claim 6 wherein each of the first and second switches comprises a transistor.

8. The integrated assembly of claim 6 wherein each of the first and second secondary-sense-amplifiers comprises fewer components than the primary-sense-amplifier.

9. The integrated assembly of claim 6 wherein the primary-sense-amplifier comprise equilibration circuitry which is lacking in the first and second secondary-sense-amplifiers.

10. The integrated assembly of claim 6 wherein the primary-sense-amplifier comprise input/output circuitry which is lacking in the first and second secondary-sense-amplifiers.

11. The integrated assembly of claim 6 wherein the primary-sense-amplifier is under the first and second memory arrays.

12. The integrated assembly of claim 11 wherein the first and second secondary-sense-amplifiers are under the first and second memory arrays.

13. The integrated assembly of claim 6 wherein the first and second memory cells comprise charge-storage devices in combination with transistors.

14. The integrated assembly of claim 6 wherein the first and second memory cells comprise capacitors in combination with transistors.

15. The integrated assembly of claim 6 wherein the second operations along the first and second columns are refresh operations.

16. An integrated assembly, comprising:
a base;
a first deck over the base;
a second deck over the first deck;
a first memory array comprising a first column of first memory cells;
a first digit line extending along the first column of the first memory cells and being utilized to address the first memory cells of said first column;
a first portion of the first column of the first memory cells being along the first deck and a second portion of the first column of the first memory cells being along the second deck;
a second memory array proximate to the first memory array and comprising a second column of second memory cells;
a second digit line extending along the second column of the second memory cells and being utilized to address the second memory cells of said second column; a first portion of the second column of the second memory cells being along the first deck and a second portion of the second column of the second memory cells being along the second deck;
a primary-sense-amplifier configured to comparatively couple the first digit line with the second digit line; the primary-sense-amplifier being along the base;
a first secondary-sense-amplifier along the first digit line and coupled to the first digit line through a first transistor; the first transistor having a first source/drain region coupled to a first portion of the first digit line, a second source/drain region coupled to a second portion of the first digit line, and a first gate coupled with an isolation driver; and
a second secondary-sense-amplifier along the second digit line and coupled to the second digit line through a second transistor; the second transistor having a third source/drain region coupled to a first portion of the second digit line, a second source/drain region coupled to a second portion of the second digit line, and a second gate coupled with the isolation driver.

17. The integrated assembly of claim 16 wherein the first and second memory cells are 1T-1C memory cells.

18. The integrated assembly of claim 16 wherein the primary-sense-amplifier is configured to be utilized during reading from and writing to the first and second memory cells along the first and second columns; and wherein the first and second secondary-sense-amplifiers are configured to be utilized only during refresh of the first and second memory cells along the first and second columns.

19. The integrated assembly of claim 16 wherein the first and second secondary-sense-amplifiers are along the base.

20. The integrated assembly of claim 19 wherein primary-sense-amplifier is between the first secondary-sense-amplifier and the second secondary-sense-amplifier.

* * * * *